United States Patent
Bliss et al.

(10) Patent No.: US 7,848,465 B2
(45) Date of Patent: Dec. 7, 2010

(54) JOINT DECODING OF ISI (INTER-SYMBOL INTERFERENCE) CHANNEL AND MODULATION CODES

(75) Inventors: William Gene Bliss, Thornton, CO (US); Thomas V. Souvignier, Longmont, CO (US)

(73) Assignee: Broadcom Corporation, Irvine, CA (US)

( * ) Notice: Subject to any disclaimer, the term of this patent is extended or adjusted under 35 U.S.C. 154(b) by 650 days.

(21) Appl. No.: 11/855,821

(22) Filed: Sep. 14, 2007

(65) Prior Publication Data

US 2008/0240278 A1 Oct. 2, 2008

Related U.S. Application Data

(60) Provisional application No. 60/921,373, filed on Apr. 2, 2007.

(51) Int. Cl.
*H04L 27/06* (2006.01)
*H03M 13/41* (2006.01)
*G11B 20/18* (2006.01)

(52) U.S. Cl. .................................. 375/341; 714/795
(58) Field of Classification Search ......... 375/260–262, 375/265, 341, 316, 338; 360/29, 32, 39, 360/48, 53, 65; 369/59.24; 714/755, 786–797, 714/E11.057
See application file for complete search history.

(56) References Cited

U.S. PATENT DOCUMENTS

| | | | | |
|---|---|---|---|---|
| 6,385,255 B1 * | 5/2002 | McLaughlin et al. | ........ | 375/263 |
| 6,507,628 B1 * | 1/2003 | McCallister et al. | ........ | 375/341 |
| 6,690,739 B1 * | 2/2004 | Mui | ........... | 375/265 |
| 7,689,896 B2 * | 3/2010 | Motwani | ..................... | 714/792 |
| 2001/0050889 A1 * | 12/2001 | Hattori et al. | ............ | 369/59.24 |
| 2002/0057640 A1 * | 5/2002 | Hattori et al. | ............ | 369/59.24 |

* cited by examiner

*Primary Examiner*—Tesfaldet Bocure
*Assistant Examiner*—Lawrence B Williams
(74) *Attorney, Agent, or Firm*—Garlick Harrison & Markison; Shayne X. Short

(57) ABSTRACT

Joint decoding of ISI (Inter-Symbol Interference) channel and modulation codes. A single, combined ISI and modulation decoding module is operable to process a signal received from an ISI communication channel and directly to generate a soft estimate of information encoded therein. A single module employs a decoding transfer function that is substantially matched to the communication channel that introduces the ISI and the modulation encoding performed on the information before being launched into the ISI communication channel. Such operations and functionality are adaptable to a variety of modulation coding systems that are tailored to deal with communication systems that introduce ISI. Moreover, such operations and functionality are extendable to communication systems employing an error correction code (ECC) such as Reed-Solomon (RS) coding as well as ECCs of an iterative nature such as LDPC (Low Density Parity Check) coding, turbo coding, and/or turbo trellis code modulation (TTCM) coding.

20 Claims, 12 Drawing Sheets

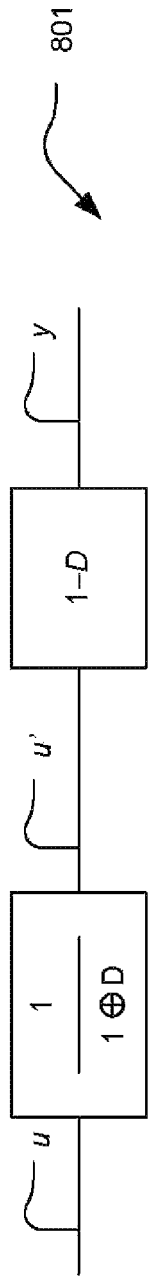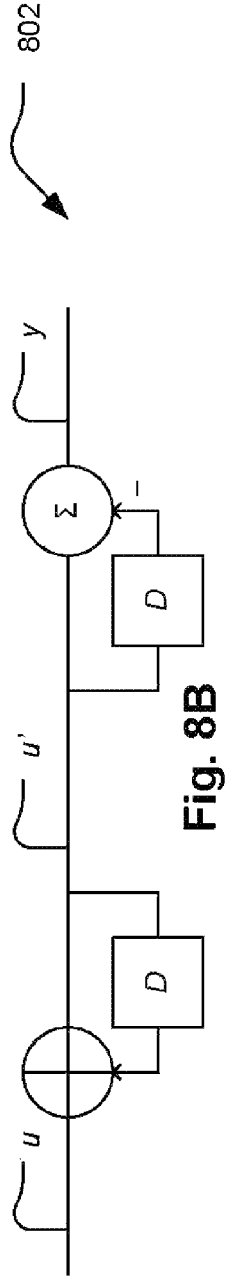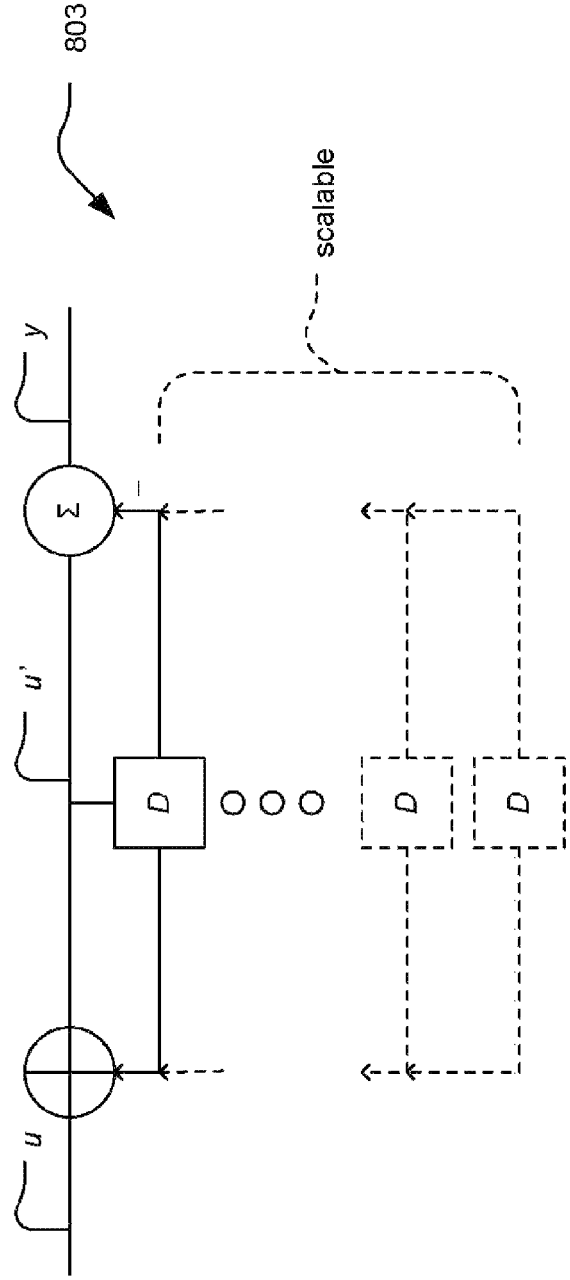

US 7,848,465 B2

JOINT DECODING OF ISI (INTER-SYMBOL INTERFERENCE) CHANNEL AND MODULATION CODES

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Application which is hereby incorporated herein by reference in its entirety and made part of the present U.S. Utility patent application for all purposes:

1. U.S. Provisional Application Ser. No. 60/921,373, entitled "Joint decoding of ISI (Inter-Symbol Interference) channel and modulation codes," filed Apr. 2, 2007, pending.

BACKGROUND OF THE INVENTION

1. Technical Field of the Invention

The invention relates generally to communication systems; and, more particularly, it relates to communication systems (including hard disk drive (HDD) systems) having communication channels that introduce ISI (Inter-Symbol Interference) to signal transmitted therein.

2. Description of Related Art

Data communication systems have been under continual development for many years. One such type of communication system that has been of significant interest lately is a communication system that employs iterative error correction codes. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

As is known, many varieties of memory storage devices (e.g. hard disk drives (HDDs)), such as magnetic disk drives are used to provide data storage for a host device, either directly, or through a network such as a storage area network (SAN) or network attached storage (NAS). Such a memory storage system (e.g., a HDD) can itself be viewed as a communication system in which information is encoded and provided via a communication channel to a storage media; the reverse direction of communication is also performed in a HDD in which data is read from the media and passed through the communication channel (e.g., sometimes referred to as a read channel in the HDD context) at which point it is decoded to makes estimates of the information that is read.

Typical host devices include stand alone computer systems such as a desktop or laptop computer, enterprise storage devices such as servers, storage arrays such as a redundant array of independent disks (RAID) arrays, storage routers, storage switches and storage directors, and other consumer devices such as video game systems and digital video recorders. These devices provide high storage capacity in a cost effective manner.

Of the many types of communication systems that have received interest in recent years, many of them undesirably introduce some degree of ISI (Inter-Symbol Interference) to signal transmitted therein. The read (and write) channel of a hard disk drive (HDD) (which can itself be viewed as being a communication channel within a communication system) is one such communication channel that oftentimes introduces ISI.

FIG. 5 illustrates a prior art embodiment of a communication system 500 employing modulation coding. Generally speaking, information u is provided to a modulation encoder 510 that is operable to modify the information (e.g., provide a certain degree of coding therein) and output a signal shown as [u'] which is then launched into an ISI (Inter-Symbol Interference) communication channel 520. In some embodiments, the ISI communication channel 520 can be viewed as being the channel through which information is written to and read from the media of a HDD (e.g., oftentimes referred to as the "read channel" in a HDD application context). This communication channel 520 introduces undesirable ISI. The signal that is then output from the ISI communication channel 520 is shown as, y, and after typically incurring some noise, the signal, $\hat{y}$=y+noise, is then received by a Viterbi detector 530 that is operable to employ the soft output Viterbi algorithm (SOVA) to determine a soft output, [$\hat{u}'$], that is indicative of the reliability of the information within the digital signal received from the ISI communication channel 520. For example, the Viterbi detector 530 is operable to determine whether the digital signal provided to it is reliable or not. In addition, the Viterbi detector 530 can be viewed as performing the parity decoding processing in the read path in response to the parity encoding processing (that is performed by a parity encoder) in the write path. The output from this Viterbi detector 530 as provided to a modulation decoder 540 that employs the same code as the modulation encoder 510. The output from this modulation decoder 530 is a best estimate, shown as $\hat{u}$, of the original information, u, that has been encoded by the modulation encoder 510.

Ideally, the best estimate, shown as $\hat{u}$, is the same as the original information, u. However, sometimes there are problems (e.g., noise, defects in the ISI communication channel 520, defects in the media in a HDD context, or other deficiencies) that prohibit an accurate estimation of information contained within the signal received from the ISI communication channel 520 that the best estimate, $\hat{u}$, is not the same as the original information, u.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 8A, FIG. 8B, and FIG. 8C illustrate embodiments of a precoded dicode communication channel.

DETAILED DESCRIPTION OF THE INVENTION

A novel approach is presented herein that is operable to employ a single decoder that is operable to perform both detection of symbols in a signal received via a communication channel that introduces ISI (Inter-Symbol Interference) as well as decoding of information bits encoded therein. A combined ISI and modulation decoding module is operable to process a received signal and directly to generate an estimate of the information bit encoded into the signal. This novel means presented herein greatly decreases complexity and improves performance for a variety of modulation encoded inter-symbol interference (ISI) systems. In some embodiments, the modulation encoders employed in this manner can be of guided scrambler (GS) form. When modulation guided scrambler (GS) type modulation encoders are used, the GS decoder can be incorporated into the ISI trellis decoder such that a single, combined module can perform both the detection and modulation decoding of the received signal in a single step. Also, embodiments adaptable to each of the following are presented herein: (1) for the general modulation system, (2) for a reverse concatenation system where both modulation encoders are of the GS type, and (3) for a reverse concatenation system where only the second modulation encoder is of the GS type. Various aspects of the invention extend automatically to iterative systems (e.g., those employing some form of error correction code (ECC)), where soft information from the second modulation encoder is needed in the iterative (LDPC (Low Density Parity Check) coding, turbo coding, turbo trellis code modulation (TTCM) coding, etc.) decoder. A novel means is presented herein that solves the long-standing problem of getting soft information to the iterative decoder with minimal complexity.

Figure 1:
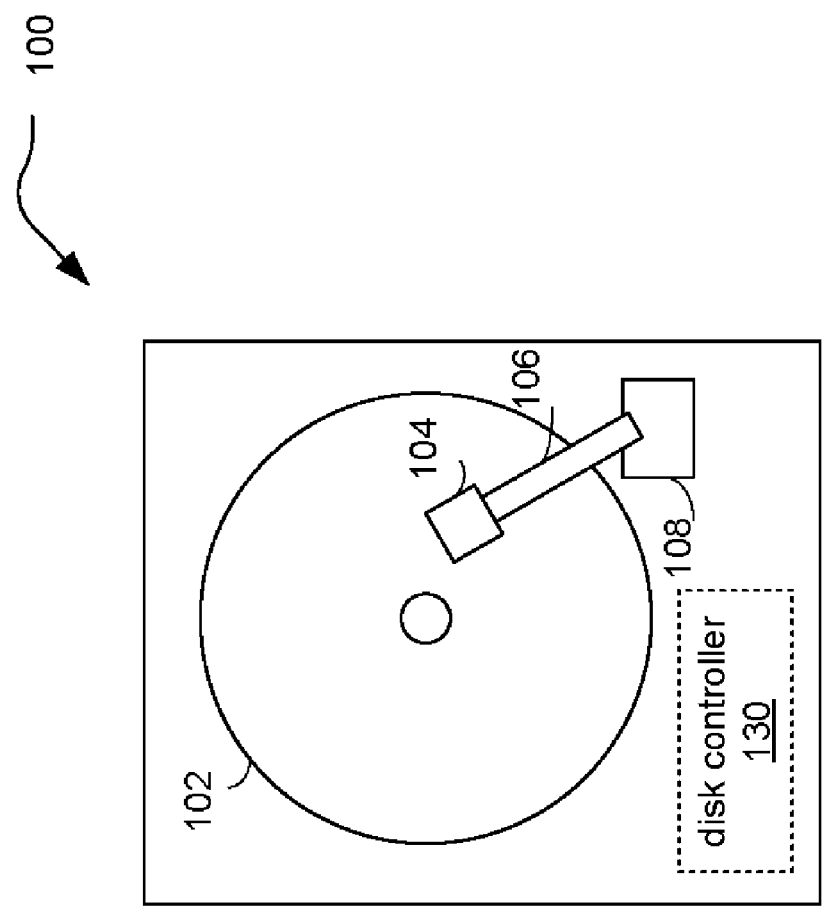
FIG. 1 illustrates an embodiment of a disk drive unit.

FIG. 1 illustrates an embodiment of a disk drive unit 100. In particular, disk drive unit 100 includes a disk 102 that is rotated by a servo motor (not specifically shown) at a velocity such as 3600 revolutions per minute (RPM), 4200 RPM, 4800 RPM, 5,400 RPM, 7,200 RPM, 10,000 RPM, 15,000 RPM; however, other velocities including greater or lesser velocities may likewise be used, depending on the particular application and implementation in a host device. In one possible embodiment, disk 102 can be a magnetic disk that stores information as magnetic field changes on some type of magnetic medium. The medium can be a rigid or non-rigid, removable or non-removable, that consists of or is coated with magnetic material.

Disk drive unit 100 further includes one or more read/write heads 104 that are coupled to arm 106 that is moved by actuator 108 over the surface of the disk 102 either by translation, rotation or both. A disk controller 130 is included for controlling the read and write operations to and from the drive, for controlling the speed of the servo motor and the motion of actuator 108, and for providing an interface to and from the host device.

Figure 2:
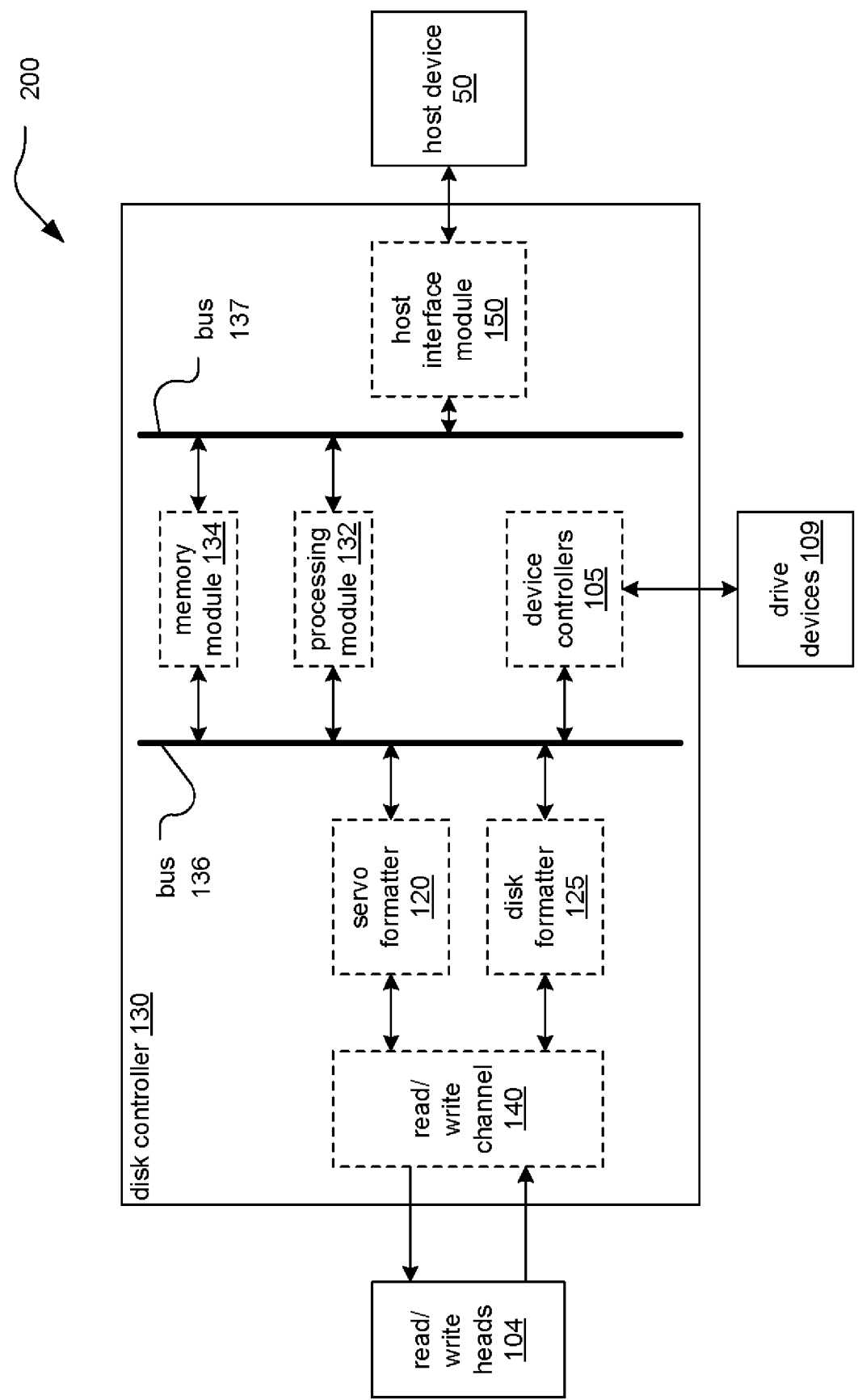
FIG. 2 illustrates an embodiment of an apparatus that includes a disk controller.

FIG. 2 illustrates an embodiment of an apparatus 200 that includes a disk controller 130. In particular, disk controller 130 includes a read/write channel 140 for reading and writing data to and from disk 102 through read/write heads 104. Disk formatter 125 is included for controlling the formatting of data and provides clock signals and other timing signals that control the flow of the data written to, and data read from disk 102. Servo formatter 120 provides clock signals and other timing signals based on servo control data read from disk 102. Device controllers 105 control the operation of drive devices 109 such as actuator 108 and the servo motor, etc. Host interface 150 receives read and write commands from host device 50 and transmits data read from disk 102 along with other control information in accordance with a host interface protocol. In one embodiment, the host interface protocol can include, SCSI, SATA, enhanced integrated drive electronics (EIDE), or any number of other host interface protocols, either open or proprietary that can be used for this purpose.

Disk controller 130 further includes a processing module 132 and memory module 134. Processing module 132 can be implemented using one or more microprocessors, micro-controllers, digital signal processors, microcomputers, central processing units, field programmable gate arrays, programmable logic devices, state machines, logic circuits, analog circuits, digital circuits, and/or any devices that manipulates signal (analog and/or digital) based on operational instructions that are stored in memory module 134. When processing module 132 is implemented with two or more devices, each device can perform the same steps, processes or functions in order to provide fault tolerance or redundancy. Alternatively, the function, steps and processes performed by processing module 132 can be split between different devices to provide greater computational speed and/or efficiency.

Memory module 134 may be a single memory device or a plurality of memory devices. Such a memory device may be a read-only memory, random access memory, volatile memory, non-volatile memory, static random access memory (SRAM), dynamic random access memory (DRAM), flash memory, cache memory, and/or any device that stores digital information. Note that when the processing module 132 implements one or more of its functions via a state machine, analog circuitry, digital circuitry, and/or logic circuitry, the memory module 134 storing the corresponding operational instructions may be embedded within, or external to, the circuitry comprising the state machine, analog circuitry, digital circuitry, and/or logic circuitry. Further note that, the memory module 134 stores, and the processing module 132 executes, operational instructions that can correspond to one or more of the steps or a process, method and/or function illustrated herein.

Disk controller 130 includes a plurality of modules, in particular, device controllers 105, processing module 132, memory module 134, read/write channel 140, disk formatter 125, and servo formatter 120 that are interconnected via bus 136 and bus 137. The host interface 150 can be connected to only the bus 137 and communicates with the host device 50. Each of these modules can be implemented in hardware, firmware, software or a combination thereof, in accordance with the broad scope of the present invention. While a particular bus architecture is shown in FIG. 2 with buses 136 and 137, alternative bus architectures that include either a single bus configuration or additional data buses, further connectivity, such as direct connectivity between the various modules, are likewise possible to implement the features and functions included in various embodiments.

In one possible embodiment, one or more modules of disk controller 130 are implemented as part of a system on a chip (SoC) integrated circuit. In an embodiment, this SoC integrated circuit includes a digital portion that can include additional modules such as protocol converters, linear block code encoding and decoding modules, etc., and an analog portion that includes device controllers 105 and optionally additional modules, such as a power supply, etc. In a further embodiment, the various functions and features of disk controller 130 are implemented in a plurality of integrated circuit devices that communicate and combine to perform the functionality of disk controller 130.

When the drive unit 100 is manufactured, disk formatter 125 writes a plurality of servo wedges along with a corresponding plurality of servo address marks at equal radial distance along the disk 102. The servo address marks are used by the timing generator for triggering the "start time" for various events employed when accessing the media of the disk 102 through read/write heads 104.

Figure 3:
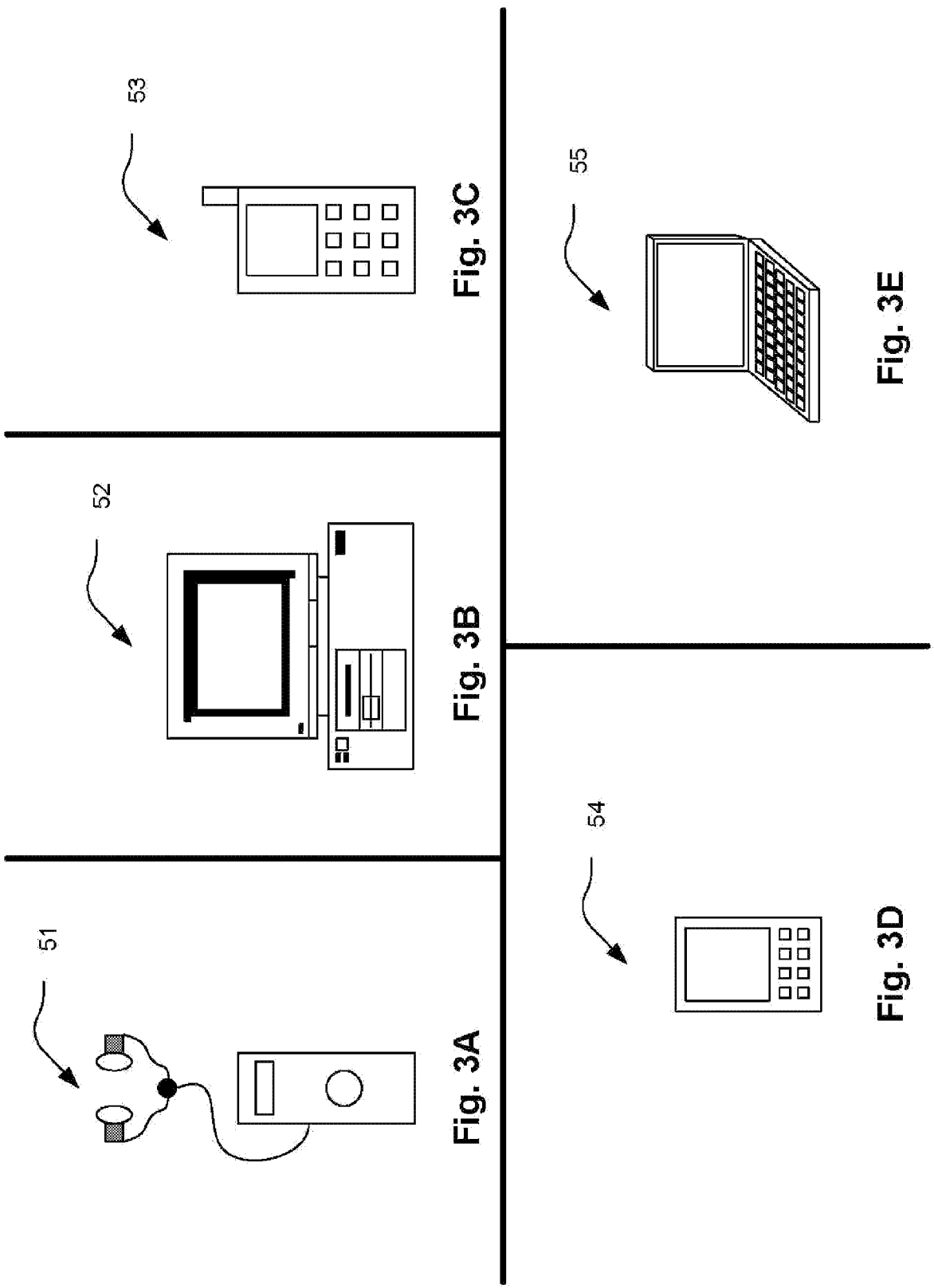
FIG. 3A illustrates an embodiment of a handheld audio unit.
FIG. 3B illustrates an embodiment of a computer.
FIG. 3C illustrates an embodiment of a wireless communication device.
FIG. 3D illustrates an embodiment of a personal digital assistant (PDA).
FIG. 3E illustrates an embodiment of a laptop computer.

FIG. 3A illustrates an embodiment of a handheld audio unit 51. In particular, disk drive unit 100 can be implemented in the handheld audio unit 51. In one possible embodiment, the disk drive unit 100 can include a small form factor magnetic hard disk whose disk 102 has a diameter 1.8" or smaller that is incorporated into or otherwise used by handheld audio unit 51 to provide general storage or storage of audio content such as motion picture expert group (MPEG) audio layer 3 (MP3) files or Windows Media Architecture (WMA) files, video content such as MPEG4 files for playback to a user, and/or any other type of information that may be stored in a digital format.

FIG. 3B illustrates an embodiment of a computer 52. In particular, disk drive unit 100 can be implemented in the computer 52. In one possible embodiment, disk drive unit 100 can include a small form factor magnetic hard disk whose disk 102 has a diameter 1.8" or smaller, a 2.5" or 3.5" drive or larger drive for applications such as enterprise storage applications. Disk drive 100 is incorporated into or otherwise used by computer 52 to provide general purpose storage for any type of information in digital format. Computer 52 can be a desktop computer, or an enterprise storage devices such a server, of a host computer that is attached to a storage array such as a redundant array of independent disks (RAID) array, storage router, edge router, storage switch and/or storage director.

FIG. 3C illustrates an embodiment of a wireless communication device 53. In particular, disk drive unit 100 can be implemented in the wireless communication device 53. In one possible embodiment, disk drive unit 100 can include a small form factor magnetic hard disk whose disk 102 has a diameter 1.8" or smaller that is incorporated into or otherwise used by wireless communication device 53 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats that may be captured by an integrated camera or downloaded to the wireless communication device 53, emails, webpage information and other information downloaded from the Internet, address book information, and/or any other type of information that may be stored in a digital format.

In a possible embodiment, wireless communication device 53 is capable of communicating via a wireless telephone network such as a cellular, personal communications service (PCS), general packet radio service (GPRS), global system for mobile communications (GSM), and integrated digital enhanced network (iDEN) or other wireless communications network capable of sending and receiving telephone calls. Further, wireless communication device 53 is capable of communicating via the Internet to access email, download content, access websites, and provide steaming audio and/or video programming. In this fashion, wireless communication device 53 can place and receive telephone calls, text messages such as emails, short message service (SMS) messages, pages and other data messages that can include attachments such as documents, audio files, video files, images and other graphics.

FIG. 3D illustrates an embodiment of a personal digital assistant (PDA) 54. In particular, disk drive unit 100 can be implemented in the personal digital assistant (PDA) 54. In one possible embodiment, disk drive unit 100 can include a small form factor magnetic hard disk whose disk 102 has a diameter 1.8" or smaller that is incorporated into or otherwise used by personal digital assistant 54 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats, emails, webpage information and other information downloaded from the Internet, address book information, and/or any other type of information that may be stored in a digital format.

FIG. 3E illustrates an embodiment of a laptop computer 55. In particular, disk drive unit 100 can be implemented in the laptop computer 55. In one possible embodiment, disk drive unit 100 can include a small form factor magnetic hard disk whose disk 102 has a diameter 1.8" or smaller, or a 2.5" drive. Disk drive 100 is incorporated into or otherwise used by laptop computer 52 to provide general purpose storage for any type of information in digital format.

Figure 4:
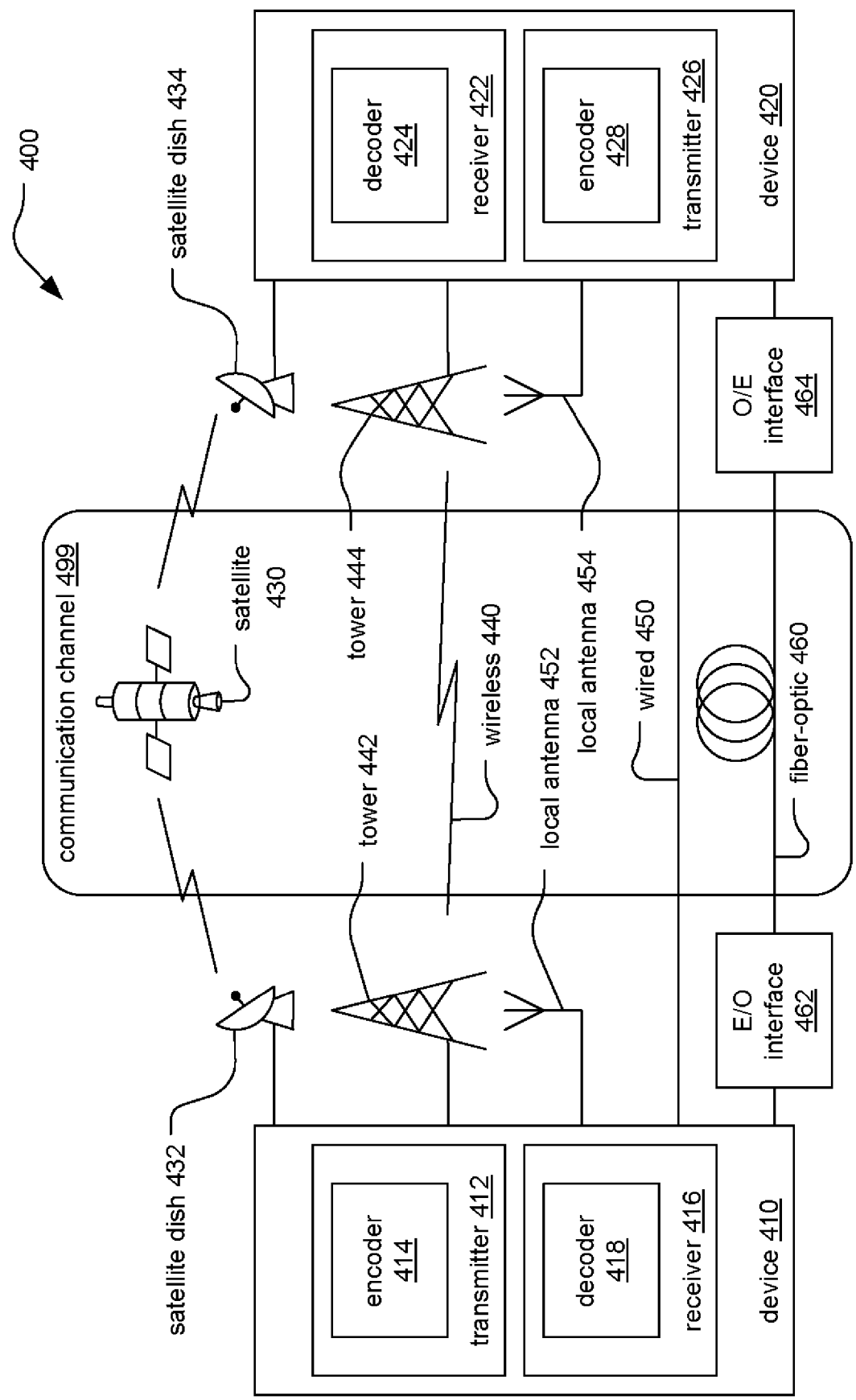
FIG. 4 illustrates an embodiment of a communication system.

FIG. 4 is a diagram illustrating an embodiment of a communication system 400.

Referring to FIG. 4, this embodiment of a communication system 400 is a communication channel 499 that communicatively couples a communication device 410 (including a transmitter 412 having an encoder 414 and including a receiver 416 having a decoder 418) situated at one end of the communication channel 499 to another communication device 420 (including a transmitter 426 having an encoder 428 and including a receiver 422 having a decoder 424) at the other end of the communication channel 499. In some embodiments, either of the communication devices 410 and 420 may only include a transmitter or a receiver. There are several different types of media by which the communication channel 499 may be implemented (e.g., a satellite communication channel 430 using satellite dishes 432 and 434, a wireless communication channel 440 using towers 442 and 444 and/or local antennae 452 and 454, a wired communication channel 450, and/or a fiber-optic communication channel 460 using electrical to optical (E/O) interface 462 and optical to electrical (O/E) interface 464)). In addition, more than one type of media may be implemented and interfaced together thereby forming the communication channel 499.

The signals employed within this embodiment of a communication system 400 can be Reed-Solomon (RS) coded signals, LDPC (Low Density Parity Check) coded signal, turbo coded signals, turbo trellis coded modulation (TTCM), or coded signal generated using some other error correction code (ECC). Any of a very wide variety of applications that employ ECC coding can benefit from various aspects of the invention, including any of those types of communication systems depicted in FIG. 4. Moreover, other types of devices and applications that employ FCC coding (e.g., including those employing some type of HDD or other memory storage means) can also benefit from various aspects of the invention.

Figure 6:
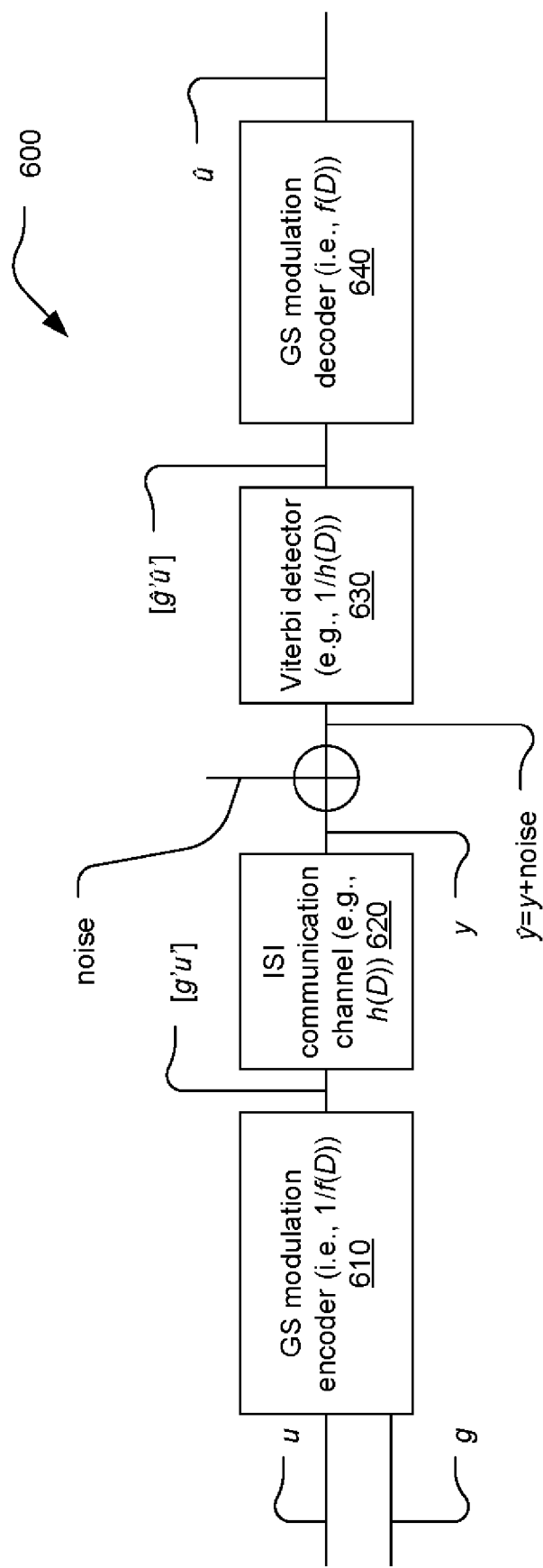
FIG. 6 illustrates an embodiment of a communication system employing guided scrambler (GS) type modulation coding.

FIG. 6 illustrates an embodiment of a communication system 600 employing guided scrambler (GS) type modulation coding. In this embodiment, information u and guide bits g are provided to a modulation encoder 610 having a GS form that is operable to modify the information (e.g., provide a certain degree of coding therein) and output a signal shown as [g'u'] which is then launched into an ISI (Inter-Symbol Interference) communication channel 620 that has a transfer function shown as h(D). This embodiment is based on the supposition that the modulation encoder 610 is of the guided scrambler (GS) form $$\frac{1}{f(D)},$$

where $f(D)=1 \oplus D \oplus \ldots \oplus D^n$ and $\oplus$ indicates modulo-2 addition. The modulation encoder 610 can operate using a run length limited (RLL) code and/or a running digital sum (RDS) code as well without departing from the scope and spirit of the invention.

In some embodiments, the ISI communication channel 620 can be viewed as being the channel through which information is written to and read from the media of a HDD (e.g., oftentimes referred to as the "read channel" in a HDD application context). This communication channel 620 introduces undesirable ISI. The signal that is then output from the ISI communication channel 620 is shown as, y, and after typically incurring some noise, the signal, $\hat{y}=y+$noise, is then received by a Viterbi detector 630 that is operable to employ the soft output Viterbi algorithm (SOVA) to determine a soft output, [$\hat{g}'\hat{u}'$], that is indicative of the reliability of the information within the digital signal received from the ISI communication channel 620. For example, the Viterbi detector 630 is operable to determine whether the digital signal provided to it is reliable or not. In addition, the Viterbi detector 630 can be viewed as performing the parity decoding processing in the read path in response to the parity encoding processing (that is performed by a parity encoder) in the write path. The output from this Viterbi detector 630 as provided to a modulation decoder 640 that also has the GS form and that employs the same code as the GS modulation encoder 610. The transfer function of the GS modulation decoder 640 is shown as 1/h(D), which is the inverse of the transfer function of the GS modulation encoder 610 (e.g., h(D)).

The output from this GS modulation decoder 630 is a best estimate, shown as û, of the original information, u, that has been encoded by the GS modulation encoder 610.

Ideally, the best estimate, shown as û, is the same as the original information, u. However, sometimes there are problems (e.g., noise, defects in the ISI communication channel 620, defects in the media in a HDD context, or other deficiencies) that prohibit an accurate estimation of information contained within the signal received from the ISI communication channel 520 that the best estimate, û, is not the same as the original information, u.

The Viterbi detector 630 in this embodiment is matched to the ISI channel h(D) and the GS modulation decoder 640 is matched to f(D). When operating in conjunction, the Viterbi detector 630 and the GS modulation decoder 640 are operable to make the best estimate, û, when processing and decoding the signal received from the ISI communication channel 620.

Figure 7:
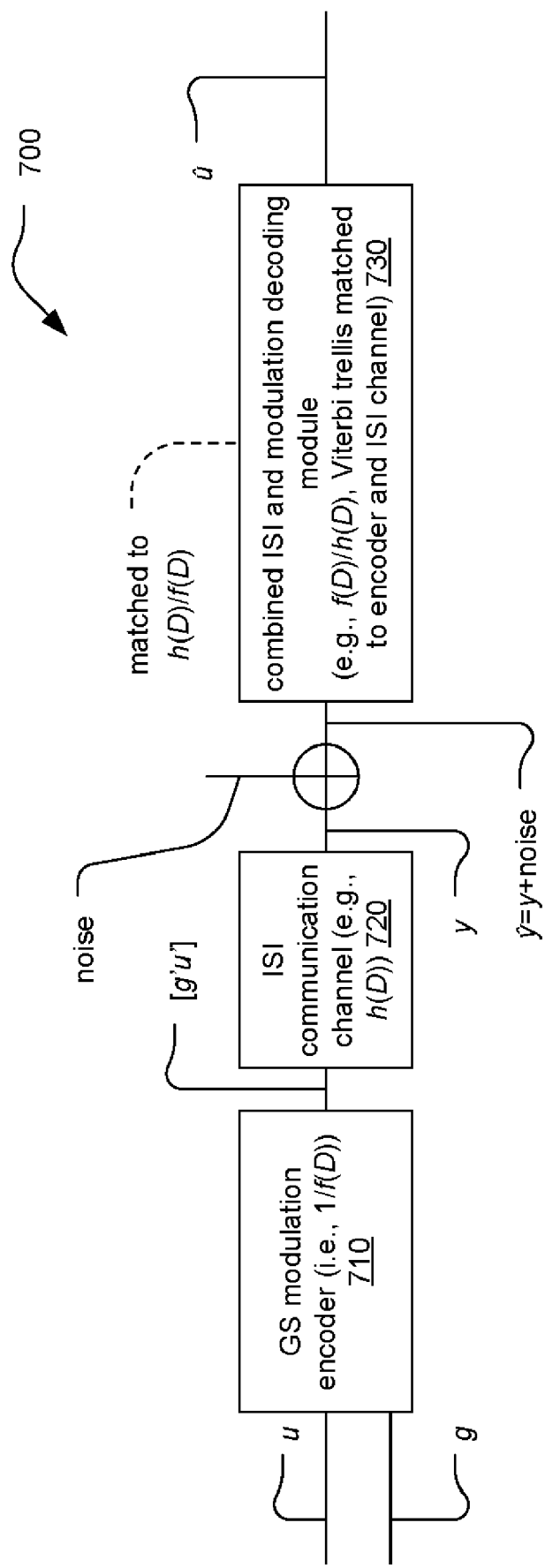
FIG. 7 illustrates an embodiment of a communication system employing guided scrambler (GS) type modulation coding and a single, combined ISI and modulation decoding module.

FIG. 7 illustrates an embodiment of a communication system 700 employing guided scrambler (GS) type modulation coding and a single, combined ISI and modulation decoding module 730. This embodiment is somewhat analogous to the previous embodiment, except it can be seen that the Viterbi detector 630 and the GS modulation decoder 640 of FIG. 6 are replaced by a single, combined ISI and modulation decoding module 730.

In this embodiment, information u and guide bits g are provided to a modulation encoder 710 having a GS form that is operable to modify the information (e.g., provide a certain degree of coding therein) and output a signal shown as [g'u'] which is then launched into an ISI (Inter-Symbol Interference) communication channel 720 that has a transfer function shown as h(D). This embodiment is based on the supposition that the modulation encoder 710 is of the guided scrambler (GS) form $$\frac{1}{f(D)},$$

where $f(D)=1 \oplus D \oplus \ldots \oplus D^n$ and $\oplus$ indicates modulo-2 addition.

Again, in some embodiments, the ISI communication channel 720 can be viewed as being the channel through which information is written to and read from the media of a HDD (e.g., oftentimes referred to as the "read channel" in a HDD application context). This communication channel 720 introduces undesirable ISI. The signal that is then output from the ISI communication channel 720 is shown as, y, and after typically incurring some noise, the signal, $\hat{y}=y+$noise, is then received by the combined ISI and modulation decoding module 730.

As can be seen when comparing the embodiments of FIG. 6 and FIG. 7, the embodiment of FIG. 7 is simplified by simplified by incorporating the functionality of the GS modulation decoder in FIG. 6 (e.g., f(D)) into the Viterbi detector 630 and arriving at the combined ISI and modulation decoding module 730.

In FIG. 7, the combined ISI and modulation decoding module 730 is matched to $$\frac{h(D)}{f(D)}$$

(e.g., employs the inverse transfer function thereof). The guide bits g, which indirectly indicate the starting state of the selected guided scrambler, also undergo encoding in the GS modulation encoder 710 (e.g., the guide bits g are encoded with $$\frac{1}{f(D)}$$

as shown in the diagram). The guide bits, g, are then removed at the Viterbi output within the combined ISI and modulation decoding module 730. There is a one-to-one mapping between the encoder input guide bits g and the corresponding encoder output guide bits g'.

The output from the combined ISI and modulation decoding module 730 is a best estimate, shown as û, of the original information, u, that has been encoded by the GS modulation encoder 710.

To demonstrate how the modulation decoder (e.g., GS modulation decoder) can be incorporated into the trellis decoder (e.g., the Viterbi detector and the GS modulation decoder can be combined into a single module), the noiseless precoded dicode channel is employed, where $f(D)=1 \oplus D$ and the equalized PR channel is depicted as $h(D)=1-D$. The FIG. 8A, FIG. 8B, and FIG. 8C illustrate embodiments 801, 802, and 803 of a precoded dicode communication channel.

Referring to embodiment 801 in FIG. 8A and to embodiment 802 in FIG. 8B, it can be seen that the block diagrams shown in these diagrams are equivalent in functionality.

Figure 5:
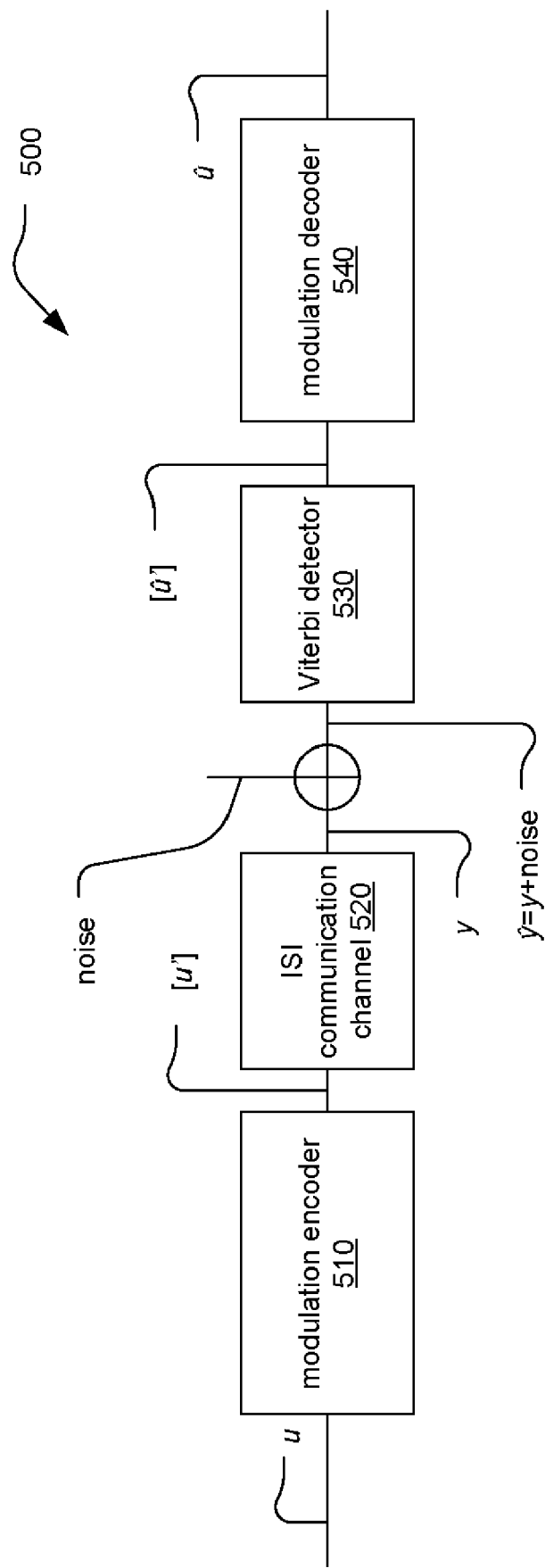
FIG. 5 illustrates a prior art embodiment of a communication system employing modulation coding.

Referring to embodiment 803 in FIG. 8C, when considering the embodiments of FIG. 8A and FIG. 8B, it is noted that the content of the delay element D is identical for both the precoder and for the channel. Therefore an equivalent block diagram is shown in FIG. 5C. The input/output relationship of this system of FIG. 8C can be described with a single trellis.

In general, if the order of the GS modulation decoder (or inverse of the GS modulation encoder), f(D), is less than or equal to the order of the inverse of the Viterbi detector (or of the ISI communication channel) (e.g., order(f(D))≦order(h(D))), then the GS modulation code does not increase the number of trellis states since the equivalent signals are stored in the delay elements of the GS encoder and the PR channel. This allows the combination of the Viterbi detector (e.g., a trellis decoding module) and the GS modulation decoder into a single module.

Figure 9:
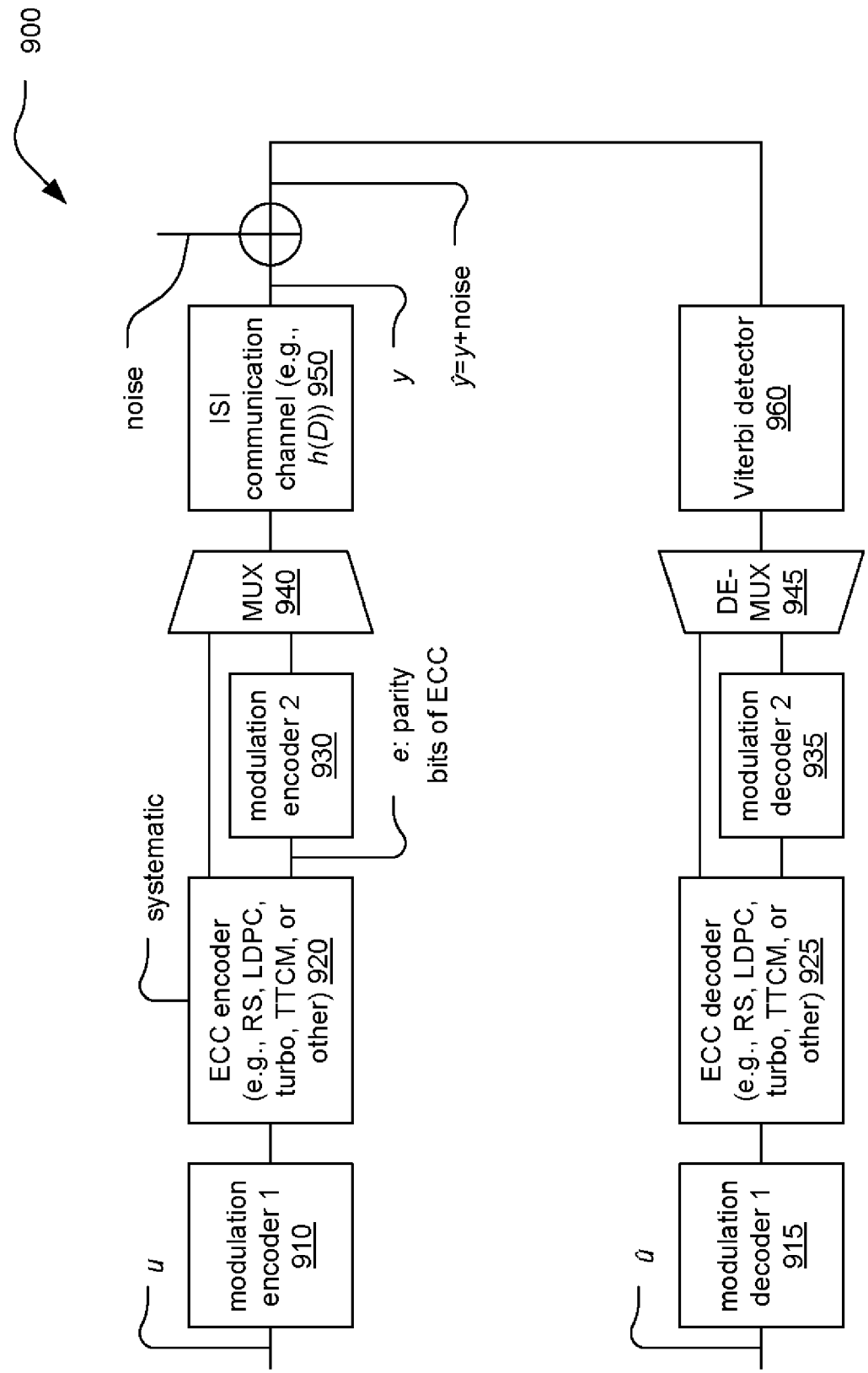
FIG. 9 illustrates an embodiment of a communication system employing two types of modulation coding and an error correction code (ECC) coding in a reverse concatenation manner.

FIG. 9 illustrates an embodiment of a communication system 900 employing two types of modulation coding and an error correction code (ECC) coding in a reverse concatenation manner.

In this embodiment, information u are provided to a modulation encoder 1 910. This modulation encoded information is then passed to an ECC encoder 920. The ECC encoder 920 can be a systematic encoder (e.g., where the output there from includes the input thereto (i.e., the same modulation encoded bits put into the ECC encoder 920 are also output from the FCC encoder 920) as well as parity bits, e. These parity bits are sometimes alternatively referred to as redundancy or coded bits. It is noted that any of a variety of ECC codes can be employed by the ECC encoder 920 including Reed-Solomon (RS) coding, LDPC (Low Density Parity Check) coding, turbo coding, and/or turbo trellis code modulation (TTCM) coding.

The parity bits, e, output from the ECC encoder 920 are provided to a modulation encoder 2 930. A multiplexor (MUX) 940 is operable to provide either the modulation encoded information or the parity bits, e, from the FCC encoder 920 to an ISI communication channel 950.

As stated above with respect to other embodiments, the ISI communication channel 950 can be viewed as being the channel through which information is written to and read from the media of a HDD (e.g., oftentimes referred to as the "read channel" in a HDD application context). This ISI communication channel 950 introduces undesirable ISI. The signal that is then output from the ISI communication channel 950 is shown as, y, and after typically incurring some noise, the signal, ŷ=y+noise, is then received by a Viterbi detector 960.

A de-multiplexor (DEMUX) 945 is operable to provide either the parity bits to a modulation decoder 2 935 (that employs the same modulation code as the modulation encoder 2 930) or the information bits to an FCC decoder 925 (that employs the same FCC code as the FCC encoder 920). After the modulation decoder 2 935 decodes the parity bits according to the appropriate modulation code, the output from the modulation decoder 2 935 is also provided to the ECC decoder 925. The output from the ECC decoder 925 is provided to a modulation decoder 1 915 (that employs the same modulation code as the modulation encoder 1 910), from which a best estimate, shown as û, of the original information, u, that has been encoded by the GS modulation encoder 910 is ultimately output.

It is noted that the modulation encoder 2 930 employs the modulation code for the FCC (e.g., Reed-Solomon (RS), LDPC (Low Density Parity Check) code, turbo code, and/or turbo trellis code modulation (TTCM) code, etc.) parity bits. In this embodiment, it is supposed that each of the modulation encoder 1 910 and the modulation encoder 2 930 are of the guided scrambler (GS) form $$\frac{1}{f(D)},$$

as also described in more detail with respect to other embodiments.

Figure 10:
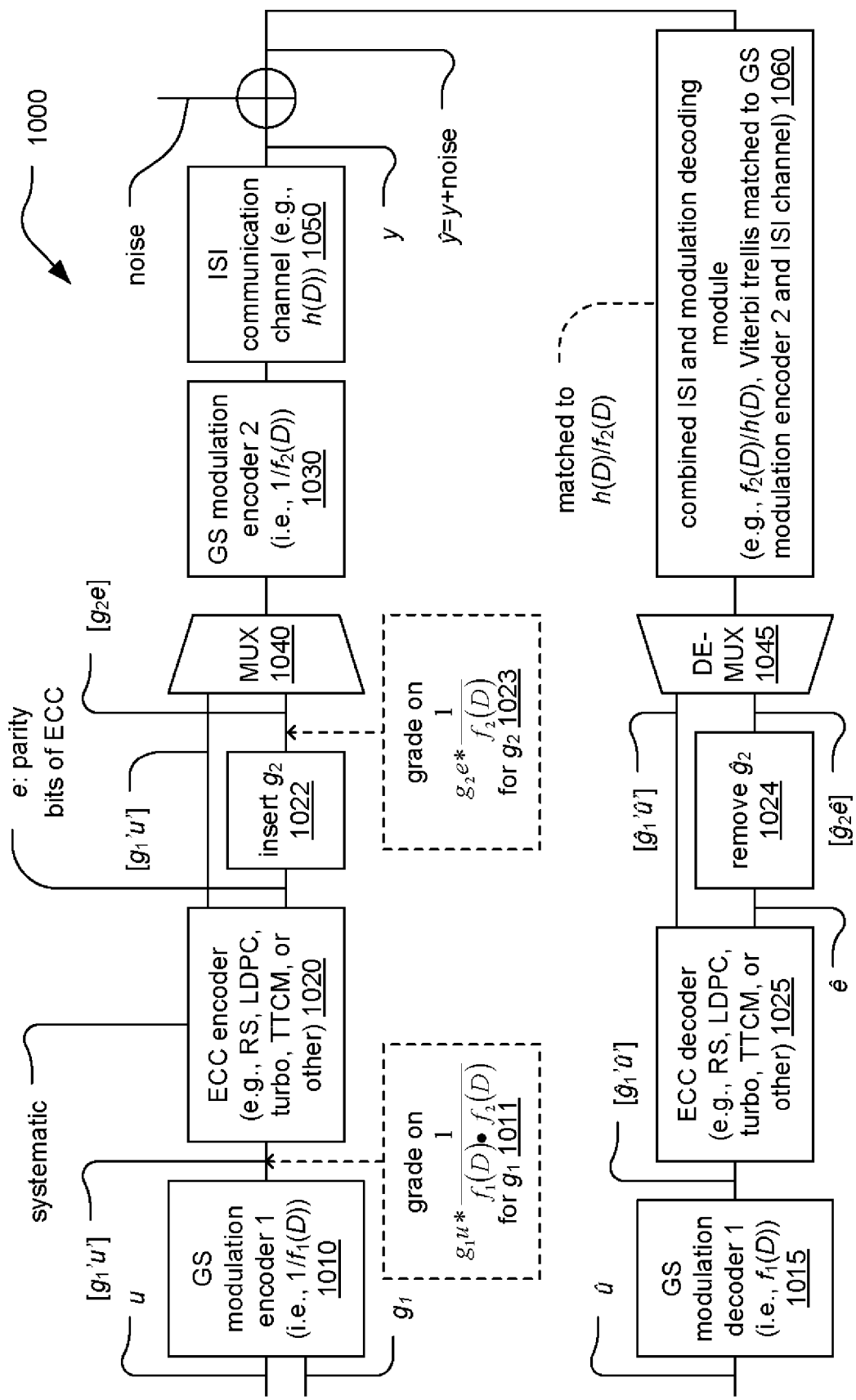
FIG. 10 illustrates an embodiment of a communication system employing two types of guided scrambler (GS) type modulation coding and an error correction code (ECC) coding in a reverse concatenation manner that allows the use of a single, combined ISI and modulation decoding module.

FIG. 10 illustrates an embodiment of a communication system 1000 employing two types of guided scrambler (GS) type modulation coding and an error correction code (ECC) coding in a reverse concatenation manner that allows the use of a single, combined ISI and modulation decoding module.

In this embodiment, information u and guide bits $g_1$ are provided to a modulation encoder 1 1010 having the guided scrambler (GS) form $$\frac{1}{f_1(D)}.$$

This modulation encoded information, $g_1'u'$, is then passed to an ECC encoder 920. The ECC encoder 1020 can be a systematic encoder (e.g., where the output there from includes the input thereto (i.e., the same modulation encoded bits put into the ECC encoder 1020 are also output from the ECC encoder 1020) as well as parity bits, e. Again, such ECC parity bits are sometimes alternatively referred to as redundancy or coded bits. In this embodiment as well, it is noted that any of a variety of ECC codes can be employed by the ECC encoder 920 including Reed-Solomon (RS) coding, LDPC (Low Density Parity Check) coding, turbo coding, and/or turbo trellis code modulation (TTCM) coding.

The parity bits, e, output from the ECC encoder 1020 are provided to a module 1022 that inserts second guide bits $g_2$. A MUX 1040 is operable to provide either the modulation encoded information $g_1'u'$ (from the ECC encoder 1020) or the parity bits (with inserted second guide bits $g_2$), $g_2e$, from the module 1022 to an ISI communication channel 1050.

As stated above with respect to other embodiments, the ISI communication channel 1050 can be viewed as being the channel through which information is written to and read from the media of a HDD (e.g., oftentimes referred to as the "read channel" in a HDD application context). This ISI communication channel 1050 introduces undesirable ISI. The signal that is then output from the ISI communication channel 1050 is shown as, y, and after typically incurring some noise, the signal, $\hat{y}=y+noise$, is then received by a combined ISI and modulation decoding module 1060.

A DEMUX 1045 is operable to provide either the parity bits (with estimate of the second guide bits $\hat{g}_2$), $[\hat{g}_2\hat{e}]$ to a module 1024 that is operable to remove the estimate of the second guide bits $\hat{g}_2$. The estimate of the parity bits, $\hat{e}$, is then provided to an ECC decoder 1025 (that employs the same ECC code as the ECC encoder 1020)

The DEMUX 1045 is also operable to provide the estimate of GS modulation encoded information (with estimate of the first guide bits $\hat{g}_1$), $[\hat{g}_1'\hat{u}']$ to the ECC decoder 1025.

The output from the ECC decoder 1025, $[\hat{g}_1'\hat{u}']$, is provided to a GS modulation decoder 1 1015 (that employs the same GS modulation code as the GS modulation encoder 1 1010), from which a best estimate, shown as $\hat{u}$, of the original information, u, that has been encoded by the GS modulation encoder 1010 is ultimately output.

In this embodiment, it can be seen that, without compromising performance, the GS modulation encoder 2 1030 (e.g., having GS form, $$\frac{1}{f_2(D)})$$

can be moved to the output of the MUX 1040 as shown in the diagram.

The first modulation encoder, GS modulation encoder 1 1010 (e.g., having GS form, $$\frac{1}{f_1(D)}),$$

encodes the input sequence u and the guide bits $g_1$. As shown, the grading for the selection of $g_1$ assumes the second modulation encoder, GS modulation encoder 2 1030 has the GS form, $$\frac{1}{f_2(D)}.$$

That is, since the output of GS modulation encoder 1 1010 is encoded with GS modulation encoder 2 1030, the selection of guide bits, $g_1$, is based on the grading as shown by reference numeral 1011, namely, $$g_1 u * \frac{1}{f_1(D) \cdot f_2(D)}.$$

For the second modulation encoder (GS modulation encoder 2 1030), the guide bits, $g_2$, are selected based on the grading as shown by reference numeral 1023, namely, $$g_2 p * \frac{1}{f_2(D)}.$$

On the read path, the modulation decoding processing corresponding to what would be a "GS modulation decoder" being matched to the form $$\frac{1}{f_2(D)}$$

(e.g., $f_2(D)$, which is the inverse of the GS modulation encoder 2 1030) is incorporated into the trellis decoding module (e.g., Viterbi detector) thereby forming a single, combined ISI and modulation decoding module 1060 without increasing complexity.

Figure 11:
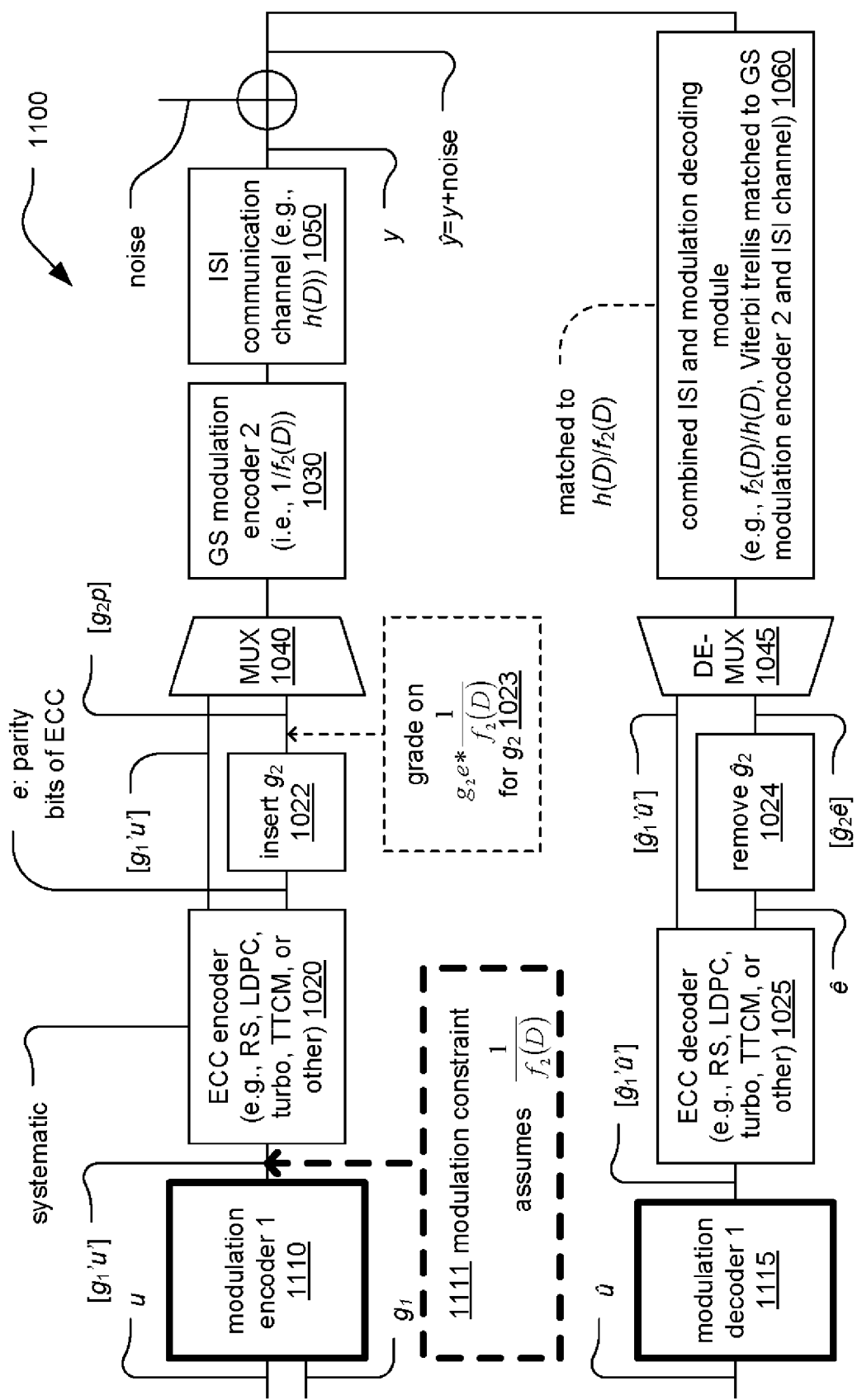
FIG. 11 illustrates an embodiment of a communication system employing two types of modulation coding (only one of which is a guided scrambler (GS) type modulation coding) and an error correction code (ECC) coding in a reverse concatenation manner that allows the use of a single, combined ISI and modulation decoding module.

FIG. 11 illustrates an embodiment of a communication system 1100 employing two types of modulation coding (only one of which is a guided scrambler (GS) type modulation coding) and an error correction code (ECC) coding in a reverse concatenation manner that allows the use of a single, combined ISI and modulation decoding module.

When considering the previous embodiment in the FIG. 10, it is noted that there is no requirement that the first modulation encoder (e.g., the GS modulation encoder 1 1010 of FIG. 10) be of the guided scrambler form. If the first modulation encoder is not of GS form (e.g., generally referred to as a modulation encoder 1 1110), then the system becomes as depicted within FIG. 11. It is noted that this embodiment assumes the modulation constraint that the signal is $$\frac{1}{f_2(D)}$$

at its output, as shown by reference numeral 1111 (e.g., that the GS modulation encoder 2 1030 has the form, $$\frac{1}{f_2(D)}).$$

Also, this embodiment employs a modulation decoder 1 1115 (that employs the same modulation code as the modulation encoder 1 1110), which need not be of the GS form as described above with respect to other embodiments.

It is also noted that, within any embodiment described herein, a Viterbi detector/Viterbi decoder can be replaced with an alternative type a soft output detector (e.g., such as one which employs the algorithms of soft output Viterbi algorithm (SOVA), the BCJR decoding algorithm [named for Bahl-Cocke-Jelinek-Raviv], etc.). Therefore soft information can be passed directly to the ECC decoder block. For iterative decoding systems, we now have a robust solution that includes a modulation constraint on the LDPC (or turbo, etc.) encoded bits.

Figure 12:
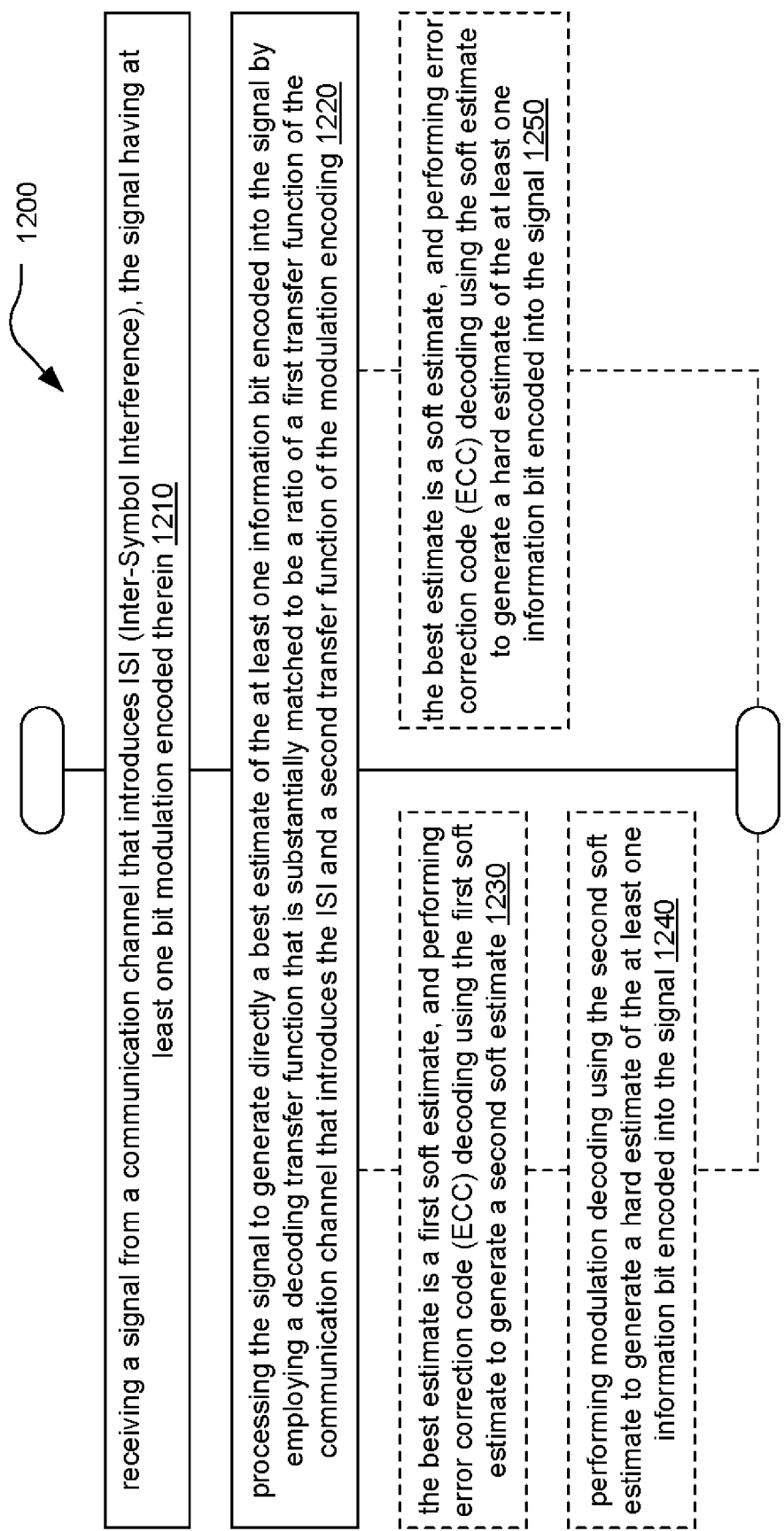
FIG. 12 illustrates an embodiment of a method for performing combined modulation and trellis decoding of a coded signal.

FIG. 12 illustrates an embodiment of a method 1200 for performing combined modulation and trellis decoding of a coded signal.

The method 1200 begins by receiving a signal from a communication channel that introduces ISI (Inter-Symbol Interference), the signal having at least one bit modulation encoded therein, as shown in a block 1210.

The method 1200 then continues by processing the signal to generate directly a best estimate of the at least one information bit encoded into the signal by employing a decoding transfer function that is substantially matched to be a ratio of a first transfer function of the communication channel that introduces the ISI and a second transfer function of the modulation encoding, as shown in a block 1220.

The method 1200 then can terminate at this point in one embodiment.

In alternative embodiments, the method 1200 can continue by performing error correction code (ECC) decoding using the first soft estimate (which is the best estimate determined in the block 1220) to generate a second soft estimate. The method 1200 then continues by performing modulation decoding using the second soft estimate to generate a hard estimate of the at least one information bit encoded into the signal.

In even alternative embodiments, the method 1200 can continue by performing error correction code (ECC) decoding using the soft estimate (which is the best estimate determined in the block 1220) to generate a hard estimate of the at least one information bit encoded into the signal.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A decoder that is operable to perform combined trellis and modulation decoding of a coded signal, the decoder comprising:
   an input that is operable to receive a signal from a communication channel, wherein:
      the signal includes an information bit encoded therein by modulation encoding; and
      during transmission across the communication channel, the communication channel introduces ISI (Inter-Symbol Interference) to the signal; and
   a combined ISI and modulation decoding module that is operable to process the signal and directly to generate a best estimate of the information bit encoded into the signal; and wherein:
   the combined ISI and modulation decoding module is operable to employ a decoding transfer function that is substantially matched to be a ratio of a first transfer function of the communication channel that introduces the ISI and a second transfer function of the modulation encoding.

2. The decoder of claim 1, wherein:
   the second transfer function of the modulation encoding is of guided scrambler form, 1/f(D);

$f(D)=1\oplus D\oplus D^2\oplus \ldots \oplus D^n$;

n is an integer;
   $\oplus$ indicates modulo-2 addition; and
   D indicates a delay period.

3. The decoder of claim 1, wherein:
   the combined ISI and modulation decoding module is operable to employ soft output Viterbi algorithm (SOVA) decoding or BCJR algorithm decoding when processing the received signal thereby substantially removing the ISI from the received signal.

4. The decoder of claim 1, wherein:
   the modulation encoding of the information bit is performed by a guided scrambler encoder;
   the guided scrambler encoder inserts a guide bit into the signal; and
   the combined ISI and modulation decoding module is operable to remove the guide bit from the received signal.

5. The decoder of claim 1, wherein:
   the modulation encoding employs at least one of a run length limited (RLL) code and a running digital sum (RDS) code.

6. The decoder of claim 1, wherein:
   a first order of the first transfer function of the communication channel that introduces the ISI is greater than a second order of an inverse of the second transfer function of the modulation encoding.

7. The decoder of claim 1, wherein:
   the communication channel is coupled to storage media that is operable to store digital information; and
   the signal is provided from the storage media via the communication channel.

8. The decoder of claim 1, wherein:
   the communication channel is a read channel of a hard disk drive (HDD); and the signal is provided from the storage media of the HDD via the read channel.

9. A decoder that is operable to perform combined trellis and modulation decoding of a coded signal, the decoder comprising:
an input that is operable to receive a signal from a communication channel, wherein:
the signal includes an information bit encoded therein by first modulation encoding, error correction code (ECC) encoding, and second modulation encoding; and
during transmission across the communication channel, the communication channel introduces ISI (Inter-Symbol Interference) to the signal; and
a combined ISI and modulation decoding module that is operable to process the signal and directly to generate a first soft estimate of the information bit encoded into the signal, wherein the combined ISI and modulation decoding module is operable to employ a decoding transfer function that is substantially matched to be a ratio of a first transfer function of the communication channel that introduces the ISI and a second transfer function of the second modulation encoding; and
an ECC decoding module that is operable to process the first soft estimate, in accordance with ECC decoding that corresponds to the ECC encoding, thereby generating a second soft estimate; and
a modulation decoding module that is operable to process the second soft estimate, in accordance with modulation decoding that corresponds to the first modulation encoding, thereby generating a hard estimate of the information bit encoded into the signal.

10. The decoder of claim 9, wherein:
the second transfer function of the second modulation encoding is of guided scrambler form, $1/f(D)$;

$f(D)=1 \oplus D \oplus D^2 \oplus \ldots \oplus D^n$;

n is an integer;
$\oplus$ indicates modulo-2 addition; and
D indicates a delay period.

11. The decoder of claim 9, wherein:
the combined ISI and modulation decoding module is operable to employ soft output Viterbi algorithm (SOVA) decoding or BCJR algorithm decoding when processing the received signal thereby substantially removing the ISI from the received signal.

12. The decoder of claim 9, wherein:
at least one of the first modulation encoding and the second modulation encoding of the information bit is performed by a guided scrambler encoder;
the guided scrambler encoder inserts a guide bit into the signal; and
the combined ISI and modulation decoding module is operable to remove the guide bit from the received signal.

13. The decoder of claim 9, wherein:
the ECC encoding includes performing one of Reed-Solomon (RS) encoding, LDPC (Low Density Parity Check) encoding, turbo encoding, and turbo trellis code modulation (TTCM) encoding.

14. The decoder of claim 9, wherein:
at least one of the first modulation encoding and the second modulation encoding employs at least one of a run length limited (RLL) code and a running digital sum (RDS) code.

15. The decoder of claim 9, wherein:
a first order of the first transfer function of the communication channel that introduces the ISI is greater than a second order of an inverse of the second transfer function of the second modulation encoding.

16. The decoder of claim 9, wherein:
the communication channel is coupled to storage media that is operable to store digital information; and
the signal is provided from the storage media via the communication channel.

17. The decoder of claim 9, wherein:
the communication channel is a read channel of a hard disk drive (HDD); and
the signal is provided from the storage media of the HDD via the read channel.

18. A method for performing combined trellis and modulation decoding of a coded signal, the method comprising:
receiving a signal from a communication channel, wherein:
the signal includes an information bit encoded therein by modulation encoding; and
during transmission across the communication channel, the communication channel introduces ISI (Inter-Symbol Interference) to the signal; and
processing the signal to generate directly a best estimate of the information bit encoded into the signal by employing a decoding transfer function that is substantially matched to be a ratio of a first transfer function of the communication channel that introduces the ISI and a second transfer function of the modulation encoding.

19. The method of claim 18, wherein:
the second transfer function of the modulation encoding is of guided scrambler form, $1/f(D)$;

$f(D)=1 \oplus D \oplus D^2 \oplus \ldots \oplus D^n$;

n is an integer;
$\oplus$ indicates modulo-2 addition; and
D indicates a delay period.

20. The method of claim 18, wherein:
the best estimate is a first soft estimate;
the signal includes an information bit encoded therein by at least one additional modulation encoding, error correction code (ECC) encoding, and the modulation encoding; and further comprising:
processing the first soft estimate, in accordance with ECC decoding that corresponds to the ECC encoding, thereby generating a second soft estimate; and
processing the second soft estimate, in accordance with modulation decoding that corresponds to the first modulation encoding, thereby generating a hard estimate of the information bit encoded into the signal.

* * * * *